United States Patent
Nam et al.

(10) Patent No.: US 7,605,729 B2
(45) Date of Patent: Oct. 20, 2009

(54) APPARATUS AND METHOD FOR CONVERTING ANALOG SIGNAL INTO DIGITAL SIGNAL TAKING AVERAGE VALUE OF ANALOG SIGNAL FOR SAMPLE PERIOD

(75) Inventors: Dong-kyung Nam, Yongin-si (KR); Ho-joon Yoo, Yongin-si (KR); Won-chul Bang, Yongin-si (KR); Sun-gi Hong, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/715,892

(22) Filed: Mar. 9, 2007

(65) Prior Publication Data
US 2008/0001799 A1 Jan. 3, 2008

(30) Foreign Application Priority Data
Jun. 30, 2006 (KR) .................. 10-2006-0060849

(51) Int. Cl.
H03M 1/00 (2006.01)
(52) U.S. Cl. ...................... 341/124; 341/155
(58) Field of Classification Search .......... 341/122–155
See application file for complete search history.

(56) References Cited

U.S. PATENT DOCUMENTS

| 4,866,436 A | * | 9/1989 | Kordts et al. ........... 340/870.28 |
| 5,028,998 A | * | 7/1991 | Westell ....................... 348/145 |
| 5,081,372 A |   | 1/1992 | Pelgrom |
| 5,117,227 A |   | 5/1992 | Goeke |
| 5,386,228 A | * | 1/1995 | Okino ...................... 348/218.1 |
| 5,631,646 A | * | 5/1997 | Erhage ......................... 341/120 |
| 6,954,414 B2 | * | 10/2005 | Nishimura et al. ..... 318/400.06 |
| 7,113,116 B2 | * | 9/2006 | Brewer et al. ............... 341/122 |

FOREIGN PATENT DOCUMENTS

| JP | 1-178873 | 7/1989 |
| JP | 403128531 A * | 5/1991 | ................ 341/122 |

(Continued)

OTHER PUBLICATIONS

International Search Report, mailed Jul. 26, 2007 and issued in corresponding International Patent Application No. PCT/KR2007/002138.

(Continued)

*Primary Examiner*—Lam T Mai
(74) *Attorney, Agent, or Firm*—Staas & Halsey LLP

(57) ABSTRACT

Provided is an apparatus and method to convert an analog signal into a digital signal, more particularly, an apparatus and method for converting an analog signal into a digital signal, the apparatus and method to perform a sampling operation by taking an average value of an analog signal for a predetermined sample period as a sample value and converting the analog signal into a digital signal using the sample value. The apparatus includes a signal input unit to which an analog signal is input; a sampling unit to perform a sampling operation by taking an average value of the analog signal for a predetermined sample period as a sample value; and a signal conversion unit to convert the analog signal into a digital signal using the sample value.

18 Claims, 13 Drawing Sheets

FOREIGN PATENT DOCUMENTS

| | | |
|---|---|---|
| JP | 4-105073 | 4/1992 |
| JP | 4-144423 | 5/1992 |
| JP | 2001-352242 | 12/2001 |
| JP | 2002-152043 | 5/2002 |
| WO | WO 95/08220 | 3/1995 |

OTHER PUBLICATIONS

Korean Patent Office Action, mailed Jul. 27, 2007 and issued in corresponding Korean Patent Application No. 10-2006-0060849.

* cited by examiner

APPARATUS AND METHOD FOR CONVERTING ANALOG SIGNAL INTO DIGITAL SIGNAL TAKING AVERAGE VALUE OF ANALOG SIGNAL FOR SAMPLE PERIOD

CROSS-REFERENCE TO RELATED APPLICATION

This application claims priority from Korean Patent Application No. 10-2006-0060849 filed on Jun. 30, 2006 in the Korean Intellectual Property Office, the disclosure of which is incorporated herein by reference in its entirety.

BACKGROUND OF THE INVENTION

1. Field of the Invention

The present invention relates to an apparatus and method to convert an analog signal into a digital signal, and more particularly, to an apparatus and method to convert an analog signal into a digital signal, the apparatus and method performing a sampling operation by taking an average value of an analog signal for a predetermined sample period as a sample value and converting the analog signal into a digital signal using the sample value.

2. Description of the Related Art

A major reason for converting analog signals into digital signals is to effectively store, process, and reproduce images. In particular, with the development of digital technology, almost all information is converted from an analog form into a digital form and is processed accordingly.

To convert analog signals into digital signals, a sensor converting a signal to be measured into an analog signal and an analog/digital (A/D) converter converting the analog signal into a digital signal are required. The sensor converting the signal to be measured into the digital signal may be an image sensor, such as a camera, or a sound sensor such as a microphone. In addition, the sensor may be any sensor that can convert a signal to be measured into a digital signal, such as an optical sensor, a chemical sensor, a temperature sensor, and a pressure sensor.

FIG. 1 is a block diagram of a conventional apparatus 10 to convert an analog signal into a digital signal.

Referring to FIG. 1, the conventional apparatus 10 includes a sensor unit 11 to convert a signal to be measured into an analog signal, an amplification unit 12 to amplify the analog signal to an appropriate size, a sample/hold unit 13 to sample the analog signal at predetermined time intervals, and an analog/digital (A/D) converter 14 to convert the analog signal into a digital signal using a sample value.

A sampling process performed by the sample/hold unit 13 has a sample mode and a hold mode according to an operating mode of the sample/hold unit 13. In the sample mode, the sample/hold unit 13 has the same value as an analog signal input at a predetermined time. In the hold mode, the sample/hold unit 13 maintains a value immediately before the sample mode is changed to the hold mode. This sampling process is called a point sampling process. For example, referring to FIG. 2, the sample/hold unit 13 performs point sampling on an analog signal 21 input at time intervals using predetermined sampling frequencies. In FIG. 2, solid lines 22 indicate the analog signal 21 sampled using higher sampling frequencies than those used to sample the analog signal 21 indicated by dotted lines 23.

According to a Nyquist sampling theory, an input analog signal can be restored using a sampling frequency higher than a predetermined level. If a sampling frequency lower than the predetermined level is used, the input analog signal cannot be properly restored.

In the point sampling process described above, if an input analog signal is sampled at a peak point thereof, it can be properly restored. However, it is technically difficult to identify the peak point of each input analog signal. In other words, referring to FIG. 3, if a sample value 31a sampled from an input analog signal 31 is not the peak point of the input analog signal 31, when the input analog signal 31 is interpolated using the sample value 31a, there is a big difference between an interpolated analog signal 32 and the input analog signal 31.

In addition, a high sample frequency may be used to properly interpolate an input analog signal. However, as a higher sampling frequency is used, the amount of data is increased, which, in turn, increases memory required to store the data. Consequently, the time spent on transmitting data for information processing and communication is increased.

Therefore, a method of obtaining an interpolated signal close to an input analog signal without using an expensive high-performance sampling apparatus to identify the peak point of the input analog signal is required.

U.S. Pat. No. 5,117,227 discloses an apparatus to convert an input analog signal into an output digital signal using a method of counting a slope count and measuring a residual voltage to perform high-speed and high-precision continuous conversion. In this disclosure, the apparatus uses an integrator and a counter to convert a sampled/held signal into a digital signal. However, a method of obtaining an interpolated signal close to an input analog signal without using an expensive high-performance sampling apparatus to identify the peak point of the input analog signal is not suggested in this disclosure.

SUMMARY OF THE INVENTION

Additional aspects and/or advantages of the invention will be set forth in part in the description which follows and, in part, will be apparent from the description, or may be learned by practice of the invention.

The present invention provides an apparatus and method to convert an analog signal into a digital signal, the apparatus and method integrating an input analog signal and performing a sampling operation by taking an average value of the input analog signal for a predetermined sample period as a sample value.

However, the embodiments of the present invention are not restricted to the one set forth herein. The above and other objectives of the present invention will become more apparent to one of daily skill in the art to which the present invention pertains by referencing a detailed description of the present invention given below.

According to an aspect of the present invention, there is provided an apparatus for converting an analog signal into a digital signal. The apparatus includes a signal input unit to which an analog signal is input; a sampling unit to perform a sampling operation by taking an average value of the analog signal for a predetermined sample period as a sample value; and a signal conversion unit to convert the analog signal into a digital signal using the sample value.

According to another aspect of the present invention, there is provided a method of converting an analog signal into a digital signal. The method includes inputting an analog signal; performing a sampling operation by taking an average value of the analog signal for a predetermined sample period as a sample value; and converting the analog signal into a digital signal using the sample value.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
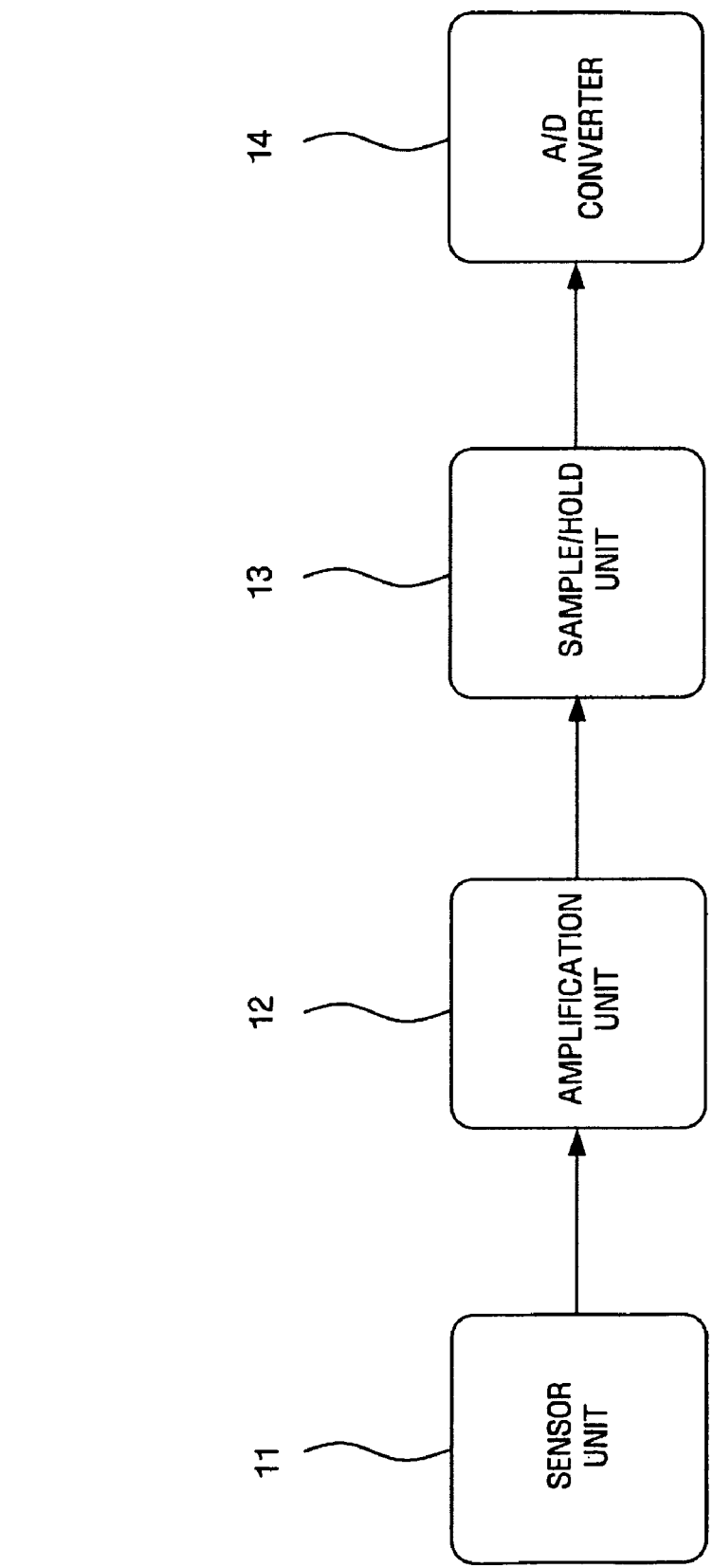
FIG. 1 is a block diagram of a conventional apparatus to convert an analog signal into a digital signal.
Figure 2:
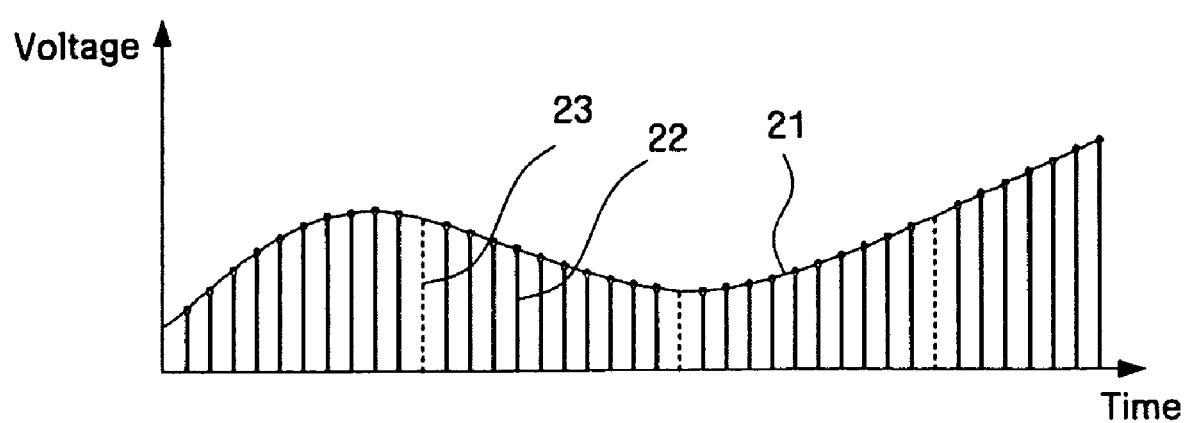
FIG. 2 is a graph illustrating a conventional point sampling method.
Figure 3:
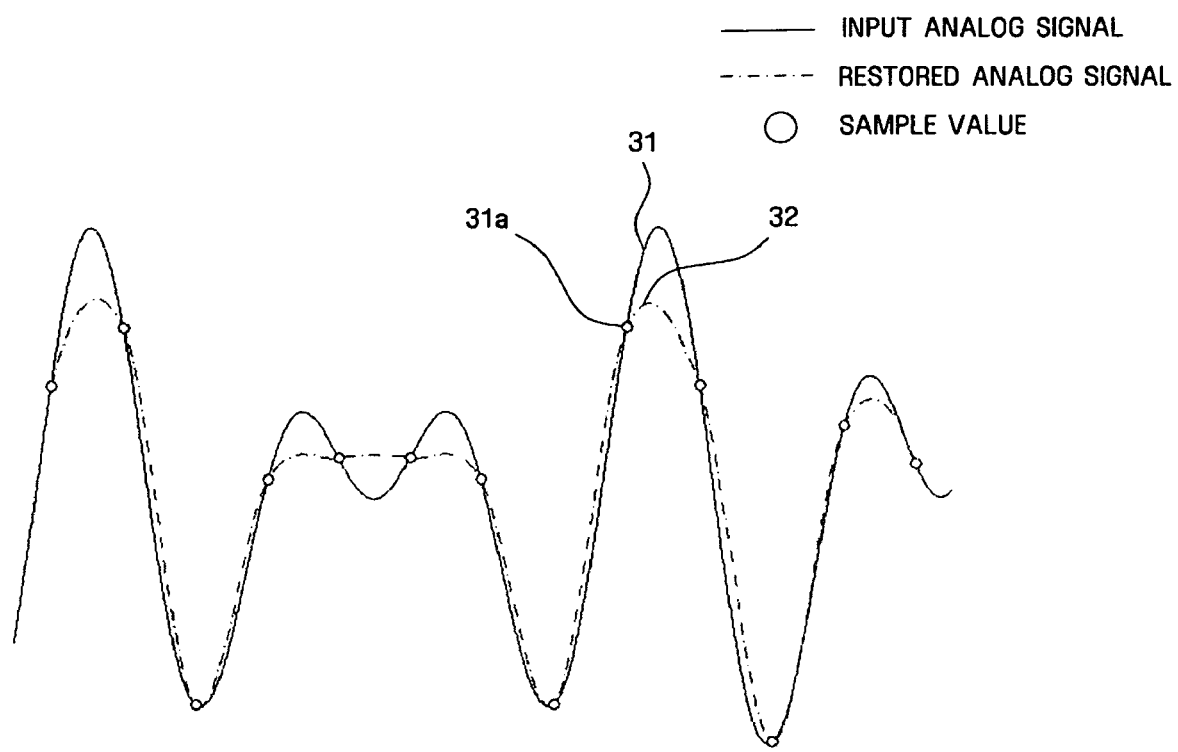
FIG. 3 is a diagram illustrating an analog signal restored using a sample value which is obtained using the conventional point sampling method.

Reference will now be made in detail to the embodiments of the present invention, examples of which are illustrated in the accompanying drawings, wherein like reference numerals refer to the like elements throughout. The embodiments are described below to explain the present invention by referring to the figures.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

Hereinafter, the present invention will be described with reference to block diagrams or flowchart illustrations. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus, such that the instructions, which execute via the processor of the computer or other programmable data processing apparatus, create means for implementing the functions specified in the flowchart block or blocks.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps to implement the functions specified in the flowchart block or blocks.

And each block of the flowchart illustrations may represent a module, segment, or portion of code, which comprises one or more executable instructions to implement the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Figure 4:
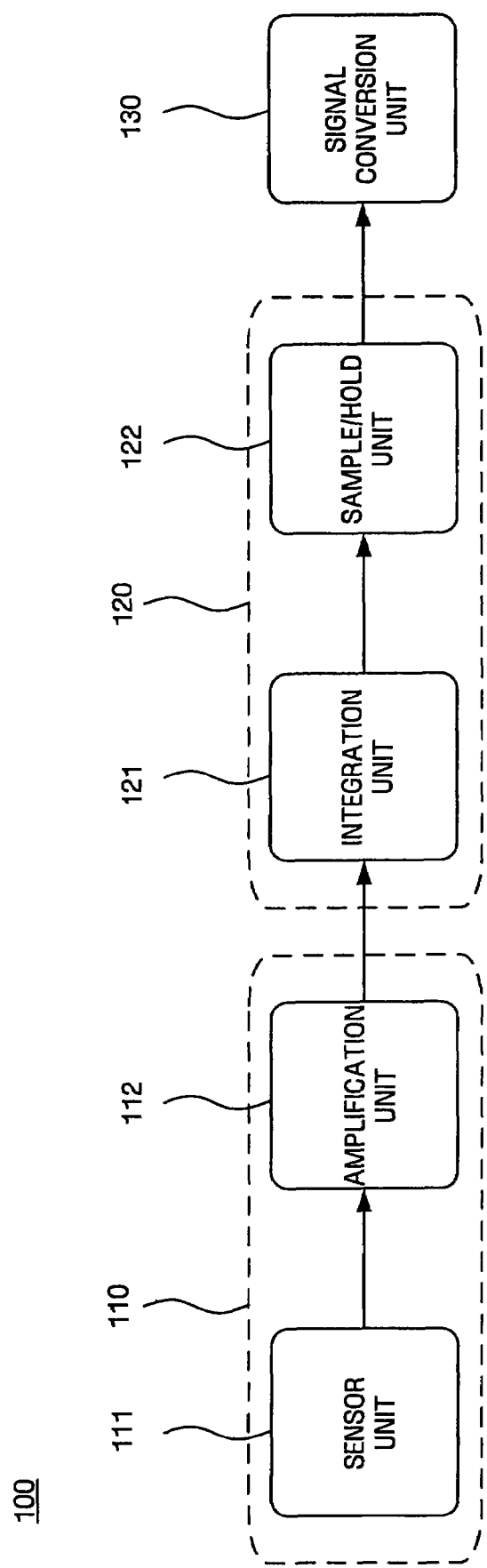
FIG. 4 is a block diagram of an apparatus to convert an analog signal into a digital signal according to an embodiment of the present invention.

FIG. 4 is a block diagram of an apparatus 100 to convert an analog signal into a digital signal according to an embodiment of the present invention.

Referring to FIG. 4, the apparatus 100 may include a signal input unit 110 to which an analog signal is input, a sampling unit 120 to perform a sampling operation by taking the average of analog signals input for a predetermined sample period as a sample value, and a signal conversion unit 130 to convert the input analog signal into a digital signal using the sample value.

The signal input unit 110 may include a sensor unit 111 to convert a signal to be measured into an analog signal and an amplification unit 112 to amplify the analog signal into an appropriate size.

According to an aspect of the present embodiment, the sensor unit 111 may be understood as an optical sensor, a chemical sensor, a temperature sensor, a sound sensor, or a pressure sensor which can convert a signal to be measured into an electrical signal. However, the present invention is not limited thereto. The sensor unit 110 may be understood as any sensor that can convert a signal to be measured into an electrical signal. An electrical signal, into which a signal to be measured is converted by the sensor unit 110, may be understood as an analog signal. In addition, an analog signal amplified by the amplification unit 112 is different from the analog signal, into which the signal to be measured is converted by the sensor unit 110, only in terms of size. Therefore, in the present embodiment, both of the analog signal output from the sensor unit 111 and the analog signal amplified by the amplification unit 112 will be referred to as an 'analog signal.'

The sampling unit 120 may include an integration unit 121 to integrate an analog signal for a predetermined sample period and a sample/hold unit 122 to sample/hold an integral value obtained after the analog signal is integrated by the integration unit 121. A sample value sampled by the sampling unit 120 may be understood as the average of the analog signals input for a predetermined sample period.

Figure 5:
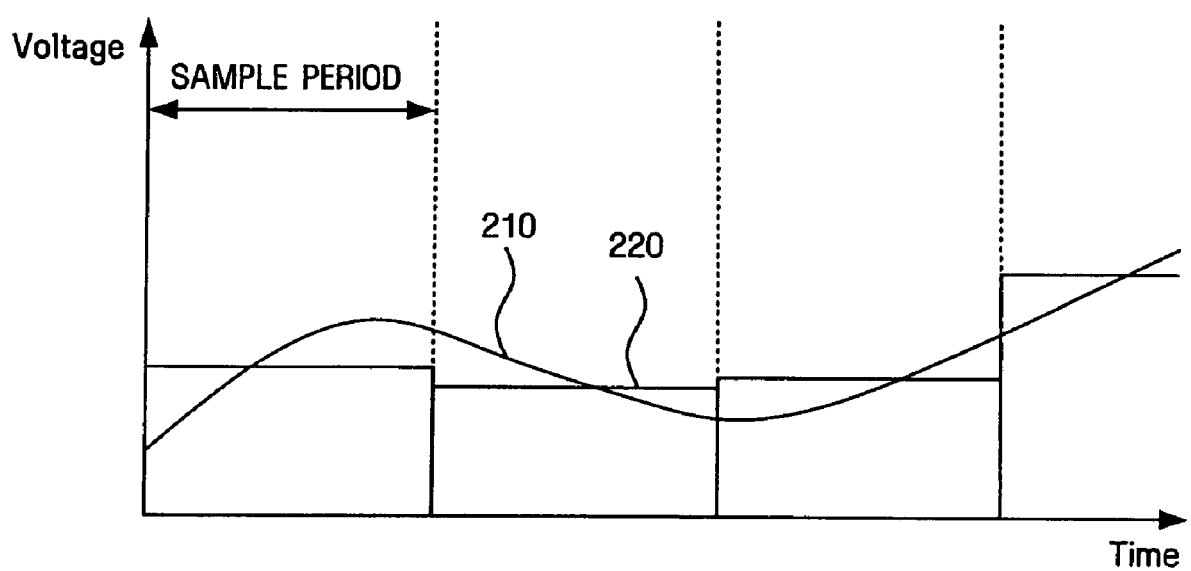
FIG. 5 is a graph illustrating a sample value according to an embodiment of the present invention.

Specifically, referring to FIG. 5, the sampling unit 120 samples an analog signal 210 input through the signal input unit 110 by integrating the analog signal 210 for a predetermined sample period and taking an integral value obtained after integrating the analog signal 210 as a sample value 220. In this case, an average value may be calculated by adding the analog signals input for a predetermined sample period divided by the sample period. The integral value may be understood as the average value.

The integration unit 121 integrates an analog signal for a predetermined sample period to obtain an average value of the analog signal for the predetermined sample period. Specifically, the average value of the analog signal may be calculated by integrating the analog signal and dividing the integrated analog signal by the length of the predetermined sample period. The sample/hold unit 122 receives an integral value calculated by the integration unit 121 and maintains the received integral value for the predetermined sample period.

Figure 6:
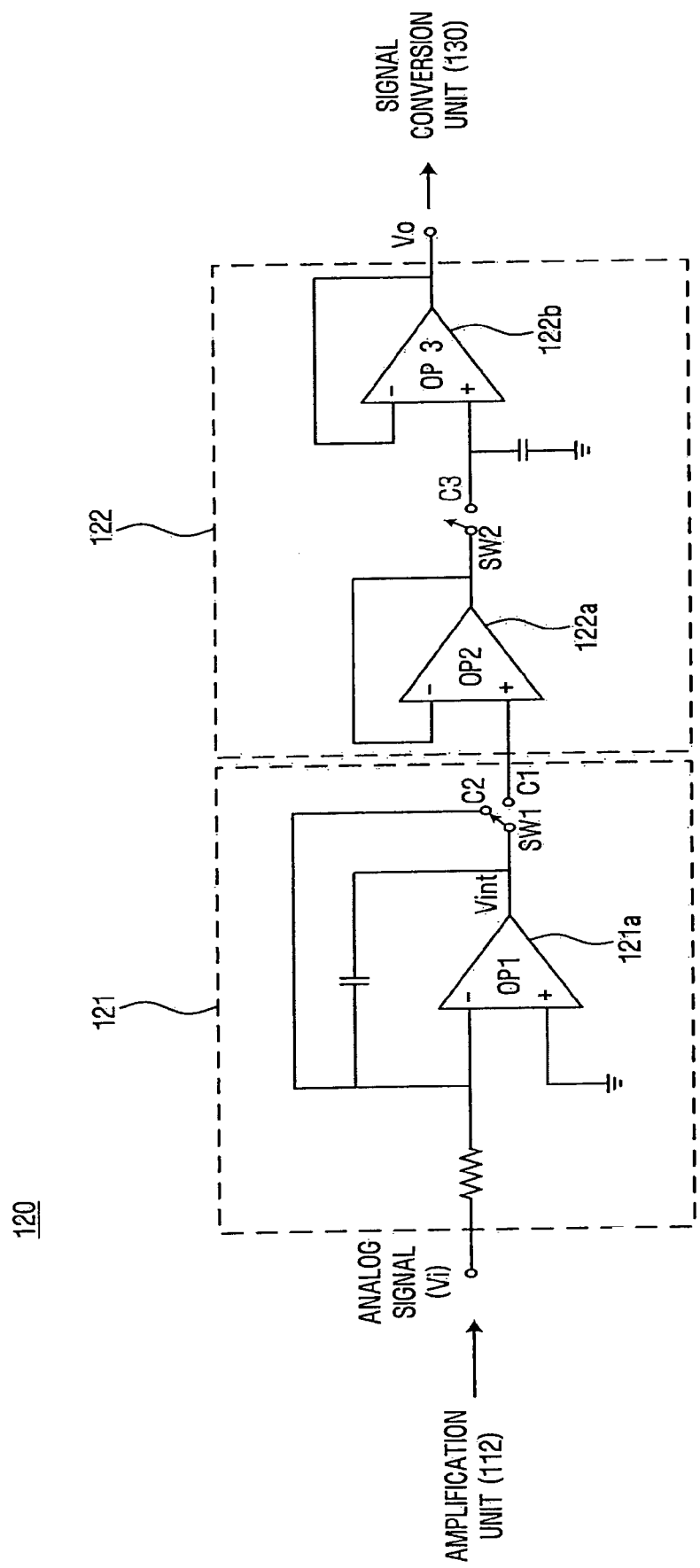
FIG. 6 is a diagram illustrating a sampling unit according to an embodiment of the present invention

FIG. 6 is a diagram illustrating a sampling unit 120 according to an embodiment of the present invention.

Referring to FIG. 6, the sampling unit 120 includes an integration unit 121 using one operational amplifier 121a and a sample/hold unit 122 using two operational amplifiers 122a and 122b. The operational amplifier 121a of the integration unit 121 will hereinafter be referred to as OP1, and the operational amplifiers 122a and 122b of the sample/hold unit 122 will hereinafter be referred to as OP2 an OP3, respectively.

The sampling unit 120 of FIG. 6 may have three states due to two switches SW1 and SW2. Specifically, the sampling unit 120 may include a first state in which the integration unit 121 integrates an analog signal, a second state in which an integral value obtained after the analog signal is integrated by the integration unit 121 in the first state is transmitted to the sample/hold unit 122, and a third state in which the sample/hold unit 122 maintains the received integral value.

For example, in the first state to integrate an analog signal, the switch SW1 is connected to a terminal C1, and thus an analog signal Vi is transmitted to the OP1 121a. In this case, since the switch SW2 is open, an output voltage Vo is unchanged and held.

In the second state to transmit an integral value, the switch SW1 is connected to the terminal C1, and an integral value Vint calculated by the integration unit 121 is transmitted to the sample/hold unit 122. In addition, the switch SW2 is connected to a terminal C3, and thus a capacitor of the sample/hold unit 122 is charged. Therefore, the output voltage Vo becomes equal to the integral value Vint.

In the third state to maintain an integral value, the switch SW2 is open, and thus the output voltage Vo is maintained as the integral value Vint transmitted to the sample/hold unit 122 in the second state. In addition, the switch SW1 is connected to the terminal C2, and thus a capacitor of the integration unit 121 is discharged at high speed.

Figure 7:
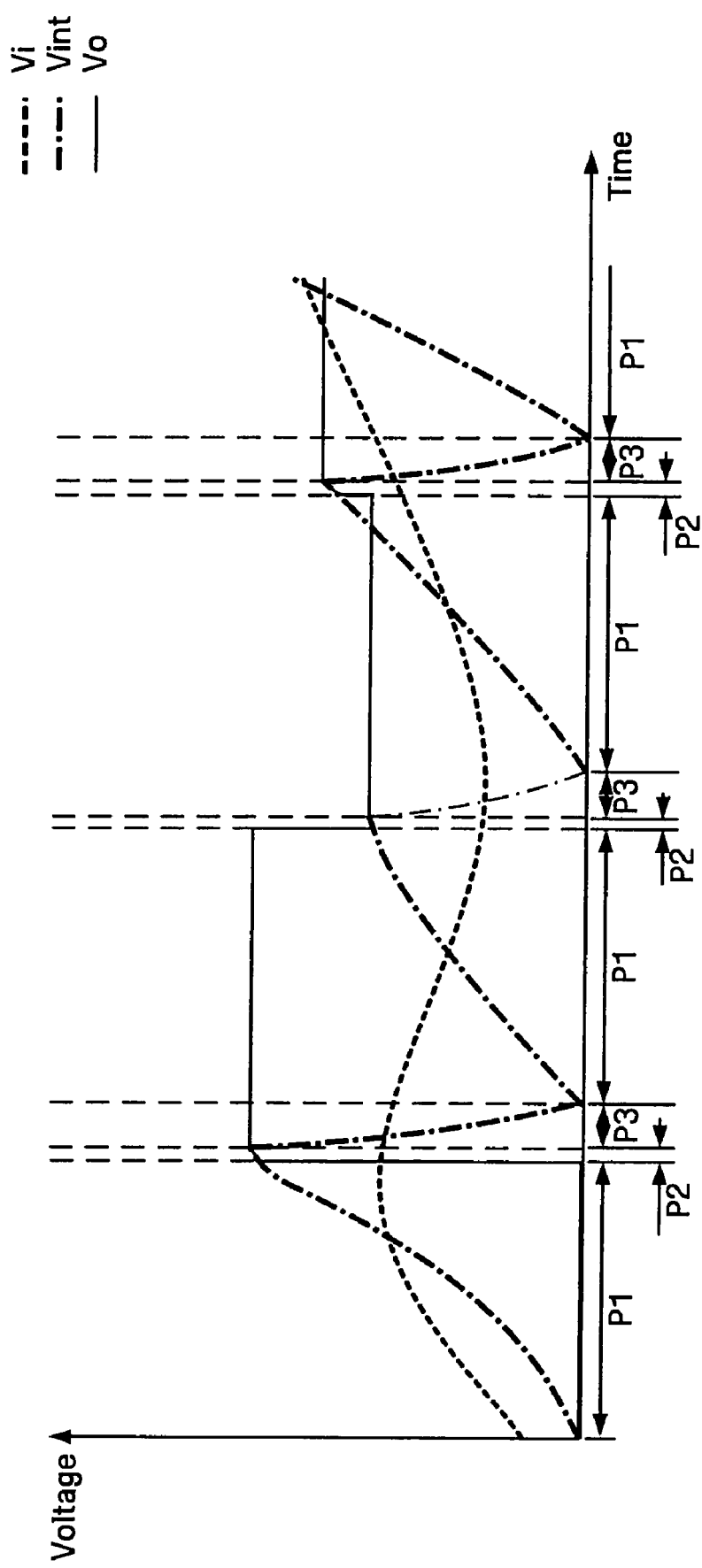
FIG. 7 is a timing diagram of the sampling unit illustrated in FIG. 6.

FIG. 7 is a timing diagram of the integration unit 121 and the sample/hold unit 122 illustrated in FIG. 6. In FIG. 7, P1 indicates the first state, P2 indicates the second state, and P3 indicates the third state.

Referring to FIG. 7, in the first state P1, the integral value Vint increases, but the output voltage Vo is held and unchanged since the switch SW2 is open. In the second state P2, since the switch SW2 is connected to the terminal C3, the output voltage Vo is equal to the integral value Vint. In the third state, the switch SW2 is open, and the switch SW1 is connected to the terminal C2. Hence, the capacitor of the integration unit 141 is discharged at high speed. Table 1 shows the states of the switches SW1 and SW2 illustrated in FIG. 7.

| State | Switch | Connection State of Switch |
|---|---|---|
| First State | SW1 | Terminal C1 |
|  | SW2 | Open |
| Second State | SW1 | Terminal C1 |
|  | SW2 | Terminal C3 |
| Third State | SW1 | Terminal C2 |
|  | SW2 | Open |

Figure 8:
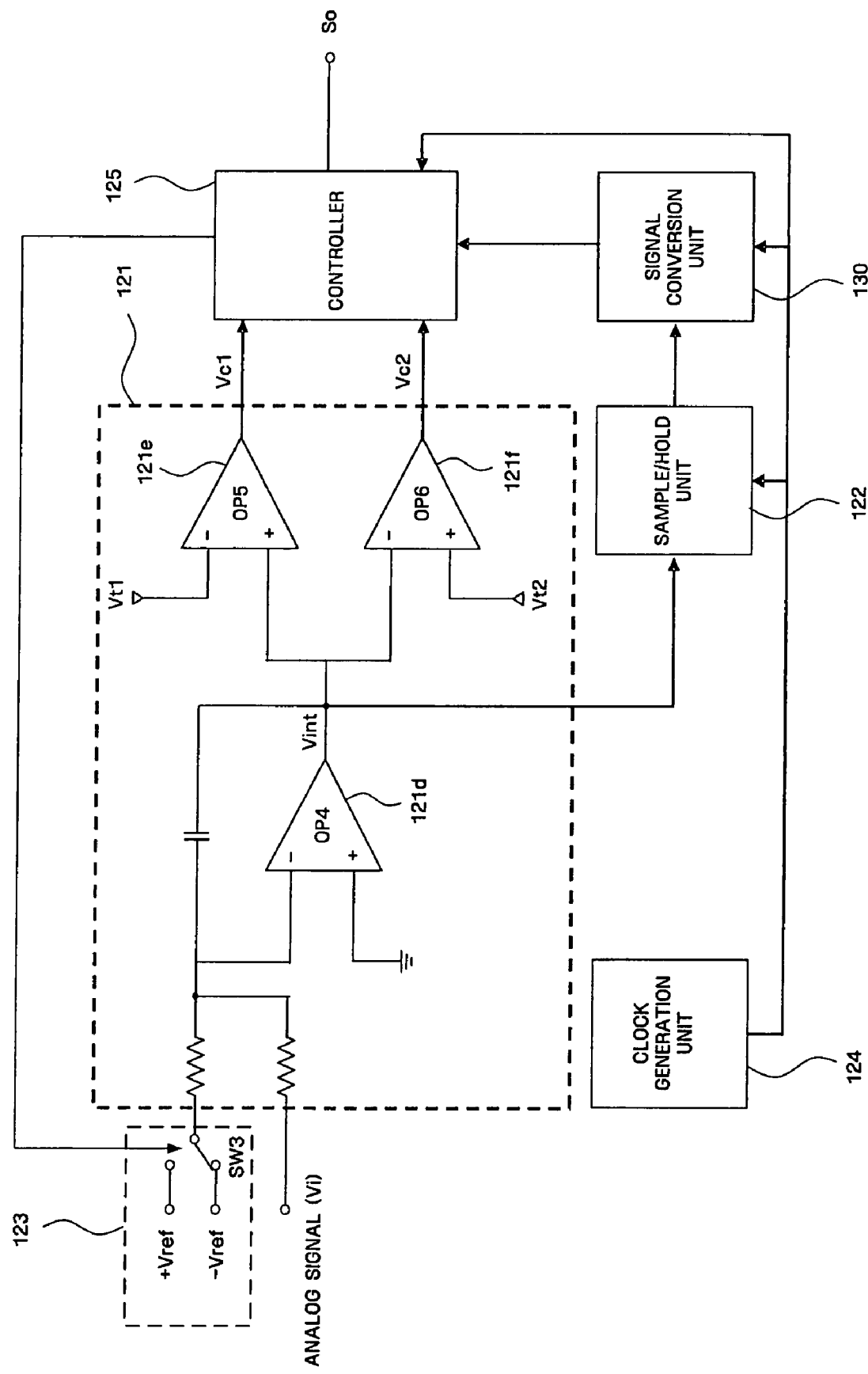
FIG. 8 is a diagram illustrating a sampling unit according to another embodiment of the present invention.

FIG. 8 is a diagram illustrating a sampling unit 120 according to another embodiment of the present invention.

Referring to FIG. 8, the sampling unit 120 includes an integration unit 131, a sample/hold unit 122, a reference signal input unit 123 selectively inputting a first reference signal +Vref and a second reference value −Vref, which have absolute values greater than that of an analog signal Vi and have a positive value and a negative value, respectively, to the integration unit 131 according to an integral value Vint, a clock generation unit 124, and a controller 125. In an embodiment of the present invention, controller 125 includes a logic circuit.

The integration unit 131 includes three operational amplifiers 121d, 121e and 121f. The operational amplifier 121d to output the integral value Vint will hereinafter be referred to as OP4, and the operational amplifiers 121e and 121f to compare the integral value Vint with a first threshold value Vt1 and a second threshold value Vt2 will hereinafter be referred to as OP5 and OP6, respectively. Output values of the OP5 121e and the OP6 121f will be referred to as Vc1 and Vc2, respectively.

Under the control of the controller 125, the reference signal input unit 123 selectively inputs the first reference signal +Vref or the second reference signal −Vref to the integration unit 131 according to Vc1 or Vc2, together with the analog signal Vi. In other words, if Vc1 is output from the OP5 121e, the controller 125 determines that the integral value Vint is greater than the first threshold value Vt1. Therefore, the controller 125 controls the reference signal input unit 123 to input the second reference signal −Vref to the integration unit 121 in a next clock and controls a switch SW3 to perform a switching operation accordingly. If Vc2 is output from the OP6 121f, the controller 125 determines that the integral value Vint is less than the second threshold value Vt2. Therefore, the controller 125 controls the reference signal input unit 123 to input the first reference signal +Vref in a next clock and controls the switch SW3 to perform the switching operation accordingly.

The clock generation unit 124 may generate an operating clock for operating the sample/hold unit 122, a signal conversion unit 130, and the controller 125.

In response to the operating clock signal from the clock generation unit 124, the controller 125 may output a digital output value So using a digital signal Vint (T) into which the integral value Vint held by the sample/hold unit 122 was converted by the signal conversion unit 130 at a time T, a digital signal Vint (T−1) into which the integral value Vint held by the sample/hold unit 122 was converted by the signal conversion unit 130 at a time T−1, and a reference signal +Vref or −Vref input at the time T−1. The digital output value So at the time T may be given by Equation (1).

$$So(T) = (Vint(T) - Vint(T-1))/Tc - Vref(T-1) \qquad (1)$$

where Tc indicates a clock cycle, and Vref (T−1) indicates the first reference signal +Vref or the second reference signal −Vref determined by Vc1 or Vc2 at the time T−1. In other words, Vc1 and Vc2 indicate whether the integral value Vint is greater than the first threshold value Vt1 or less than the second threshold value Vt2.

If the integral value Vint becomes greater than the first threshold value Vt1, the reference signal input unit 123 inputs the second reference signal −Vref to the integration unit 131 such that a resultant value of the analog signal Vi+ the second reference signal −Vref becomes a negative value, thereby lowering the integral value Vint.

Figure 9:
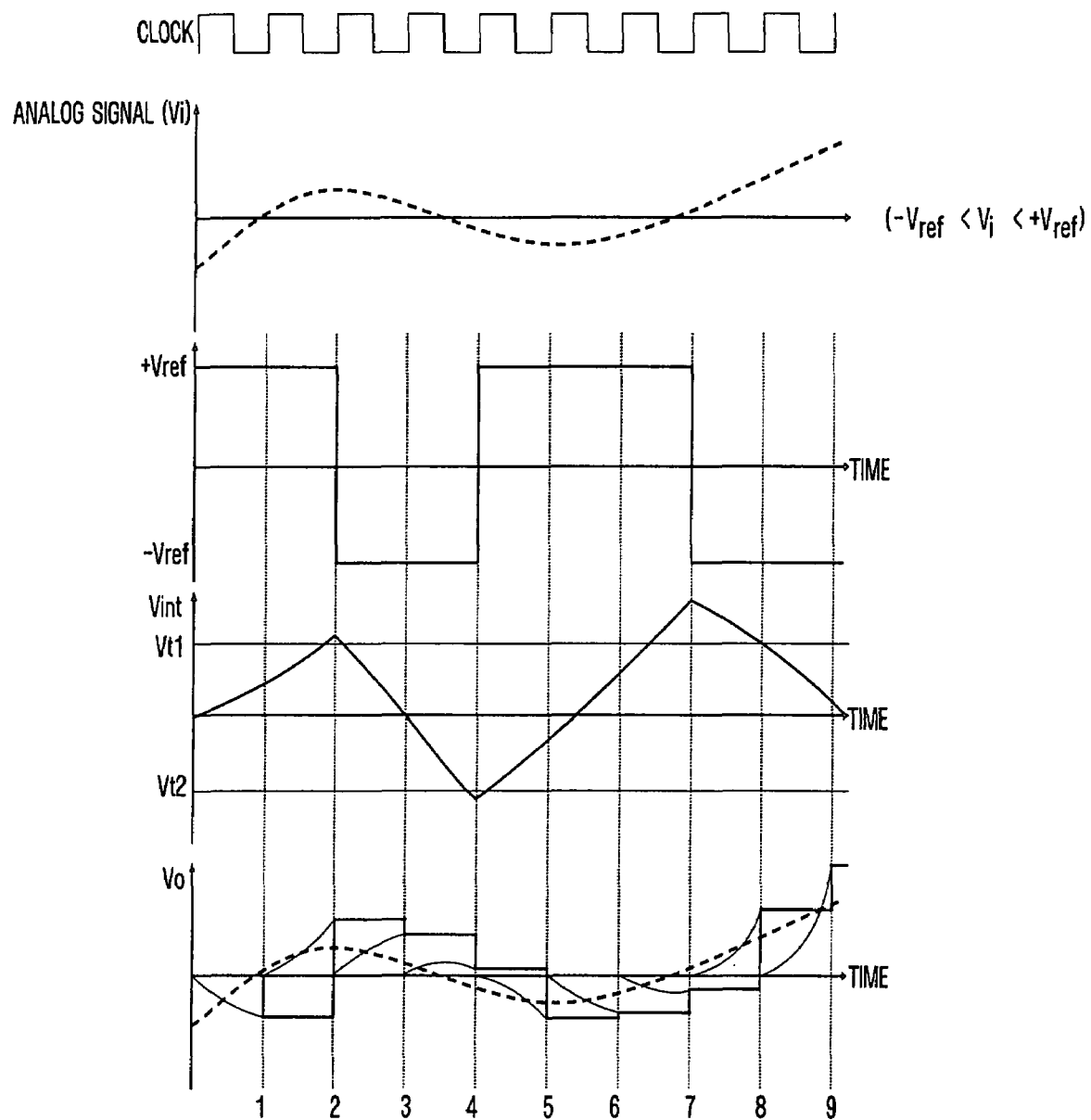
FIG. 9 is a timing diagram of the sampling unit illustrated in FIG. 8.

FIG. 9 is a timing diagram of the sampling unit 120 illustrated in FIG. 8. Referring to FIG. 9, the integral value Vint becomes greater than the first threshold value Vt1 between a time 1 and a time 2, and thus Vc1 has a positive value. Therefore, the controller 125 controls the switch SW3 of the reference signal input unit 123 to input the second reference signal −Vref to the integration unit 131. Consequently, the integral value Vint starts to decrease at a time 2. Between a time 3 and a time 4, the integral value Vint becomes less than the second threshold value Vt2, and thus Vc2 has a positive value. Therefore, the controller 125 controls the switch SW3 of the reference signal input unit 123 to input the first reference signal +Vref to the integration unit 131. Consequently, the integral value Vint starts to increase at time 4. In this case, Vo indicates an analog representation of the digital output signal generated by So, and thus is the sum of regions in a sample period.

In FIG. 9, all analog signals in the sample period can be integrated. Therefore, signal distortion, which occurs within the sample period because analog signals cannot be integrated while the capacitor of the integration unit 141 is discharged, can be prevented.

The signal conversion unit 130 may be understood as an analog/digital (A/D) converter which converts an input analog signal into a digital signal using a sample value sampled by the sampling unit 120.

Figure 10:
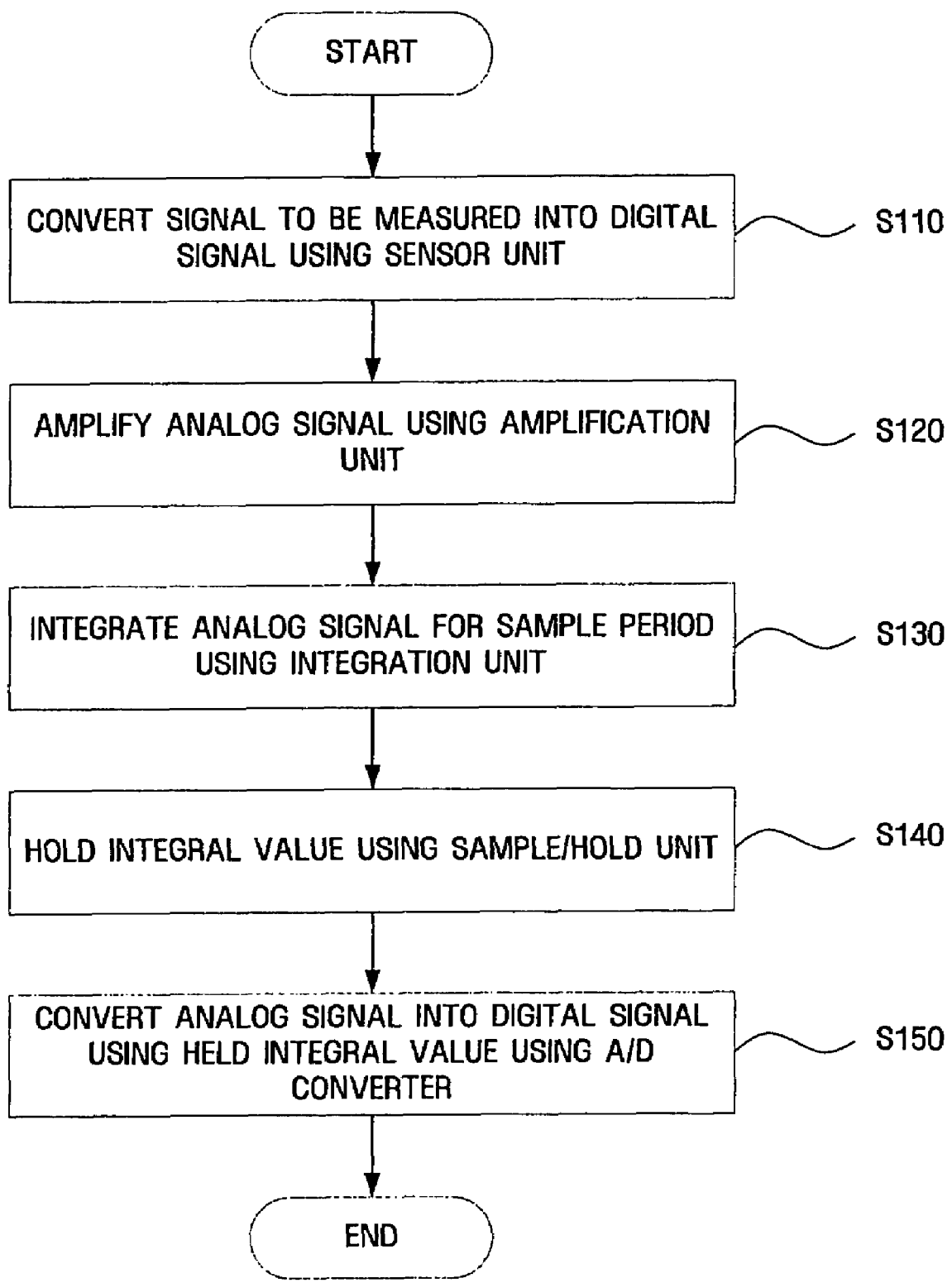
FIG. 10 is a flowchart illustrating a method of converting an analog signal into a digital signal according to an embodiment of the present invention.

FIG. 10 is a flowchart illustrating a method of converting an analog signal into a digital signal according to an embodiment of the present invention.

Referring to FIG. 10, the sensor unit 111 converts a signal to be measured into a digital signal (operation S110), and the amplification unit 112 amplifies the analog signal into an appropriate size (operation S120). In this case, the amplification unit 112 amplifies only the size of the analog signal. Therefore, there are no other changes in the analog signal.

The integration unit 121 integrates the amplified analog signal for a predetermined sample period (operation S130). The sample period used by the integration unit 121 may be determined in advance, by a user, or at default. However, the present invention is not limited thereto.

The sample/hold unit 122 receives an integral value from the integration unit 121 and maintains the received integral value (operation S140).

Thereafter, the signal conversion unit 130 receives the integral value maintained by the sample/hold unit 122 and converts the received integral value into a digital signal (operation S150).

To interpolate an input analog signal using a sample value sampled as described above, regions of the analog signal before and after interpolation must be the same. Therefore, the interpolation of the analog signal must be performed in an integral domain instead of a signal domain. A process of interpolating an input analog signal using a sample value will now be described with reference to FIGS. 11A through 11D.

Figure 11A:
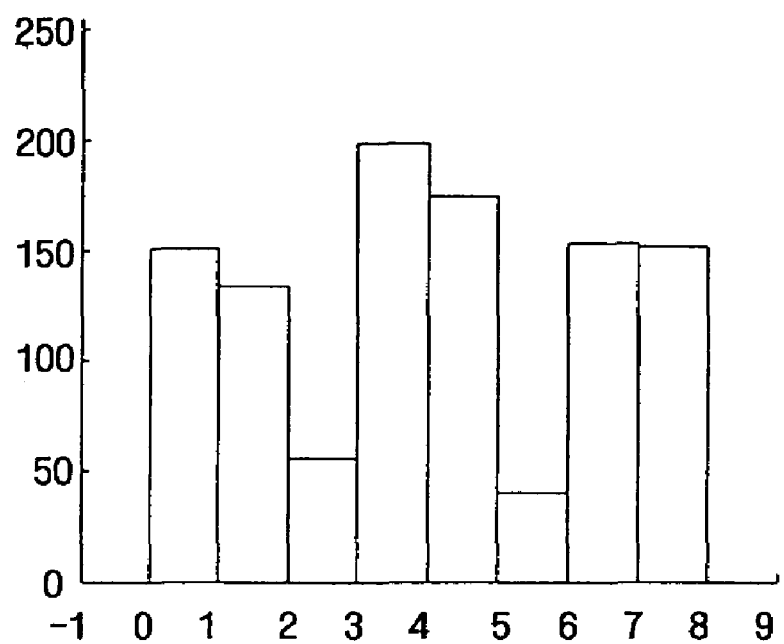
FIGS. 11A through 11D illustrate an interpolation process using a sample value according to an embodiment of the present invention.
Figure 11B:
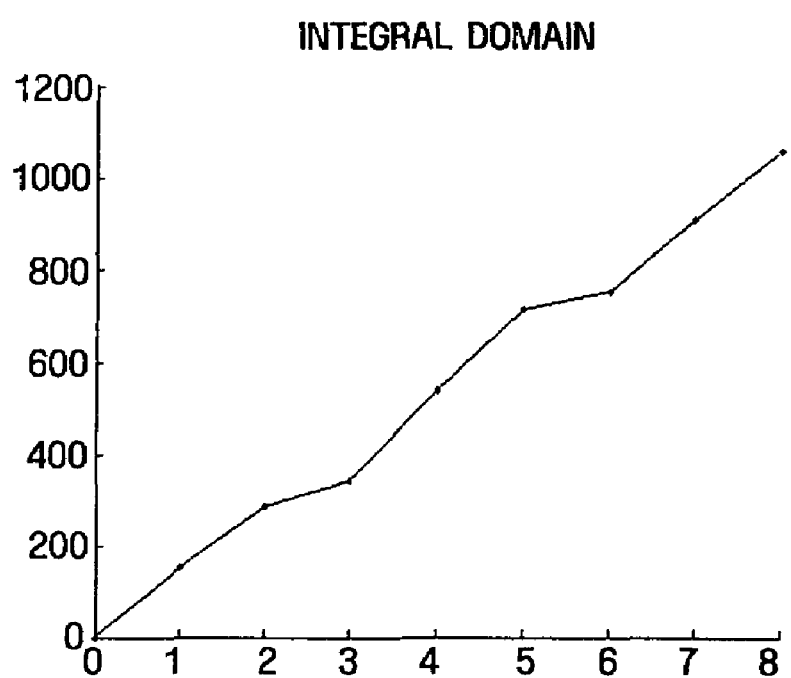

Referring to FIGS. 11A through 11D, to interpolate an input analog signal using a sample value, a sample value corresponding to a sample period in FIG. 11A is converted into an integral domain as illustrated in FIG. 11B. In FIG. 11B, interpolation is performed using various methods such as linear interpolation, cubic interpolation, Hermite polynomial interpolation, and spline interpolation. However, the present invention is not limited thereto.

Figure 11C:
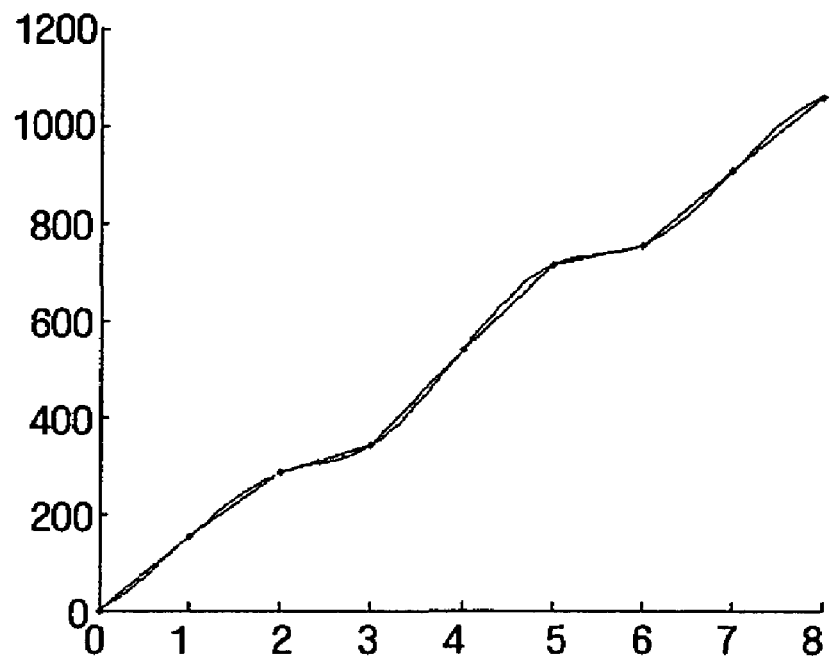
Figure 11D:
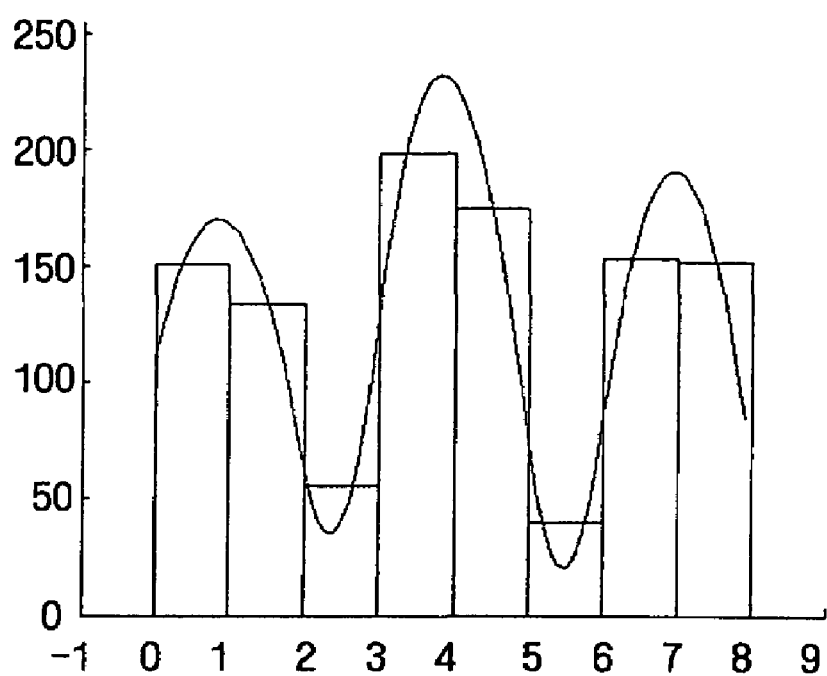
Figure 12:
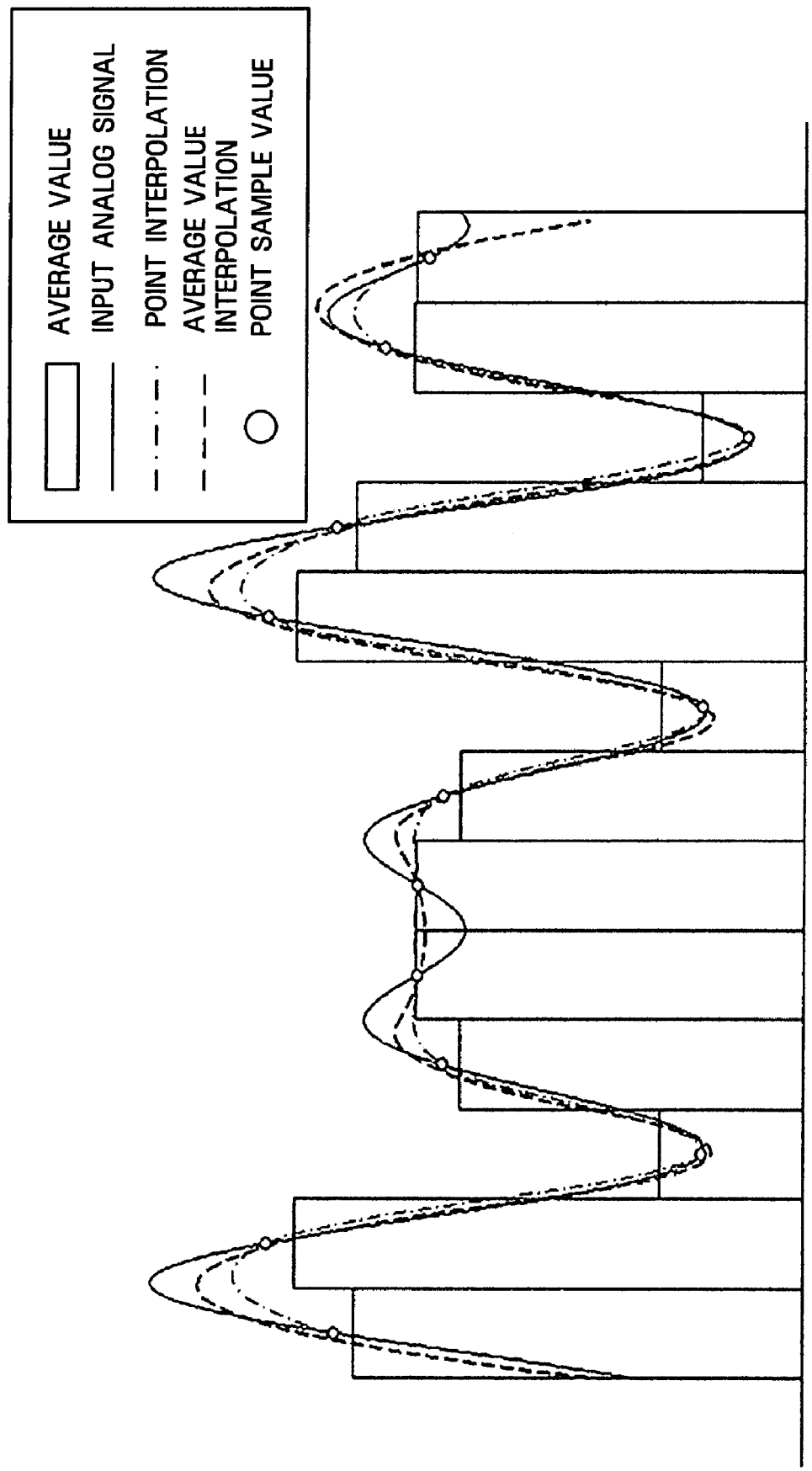
FIG. 12 is a diagram illustrating an analog signal restored using a sample value according to an embodiment of the present invention.

If FIG. 11B is interpolated using various interpolation methods described above, FIG. 11C can be obtained. Then, if FIG. 11C is differential, the input analog signal can be restored as illustrated in FIG. 11D. As such, if the input analog signal is restored, the analog signal restored using an average value as illustrated in FIG. 12, is more close to the input analog signal than an analog signal restored using conventional point sampling.

As described above, an apparatus and method for converting an analog signal into a digital signal according to the present invention provide at least one of the following advantages.

First, an average value of an analog signal for a sample period is taken as a sample value. Therefore, the analog signal can be better restored without using a high-performance sensor, and an increase in the amount of data to be processed can be minimized.

Second, a discretization error which may occur when a low-speed sensor is used can be prevented.

The term 'unit', as used herein, means, but is not limited to, a software or hardware component, such as a Field Programmable Gate Array (FPGA) or Application Specific Integrated Circuit (ASIC), which performs certain tasks. A unit may advantageously be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus to convert an analog signal into a digital signal, the apparatus comprising:
   a signal input unit to which an analog signal is input;
   a sampling unit to perform a sampling operation by taking an average value of the analog signal for a predetermined sample period as a sample value, the sampling unit including an integration unit integrating the analog signal for the predetermined sample period and a sample/hold unit sampling/holding an integral value obtained after the analog signal is integrated by the integration unit; and
   a signal conversion unit to convert the analog signal into a digital signal using the sample value.

2. The apparatus of claim 1, wherein the integration unit includes an operational amplifier.

3. The apparatus of claim 1, wherein the sampling unit has:
   a first state in which the integration unit integrates the analog signal;
   a second state in which the integral value is transmitted to the sample/hold unit; and a third state in which the sample/hold unit holds the received integral value.

4. The apparatus of claim 3, further comprising a reference voltage input unit inputting to the sampling unit the analog signal and any one of a first reference signal and a second reference signal which have absolute values greater than an absolute value of the analog signal and have a positive value and a negative value, respectively.

5. The apparatus of claim 4, wherein the reference voltage input unit inputs the second reference signal to the integration unit if the integral value of the integration unit is greater than a first threshold value.

6. The apparatus of claim 5, wherein the reference voltage input unit inputs the first reference signal to the integration unit if the integral value of the integration unit is less than a second threshold value, which is less than the first threshold value.

7. An apparatus for converting an analog signal into a digital signal, the apparatus comprising:
   a signal input unit to which an analog signal is input;
   a reference signal input unit to input any one of a first reference signal and a second reference signal;
   a sampling unit performing a sampling operation by taking an average value of the analog signal during a predetermined sample period as a sample value;
   a signal conversion unit converting the analog signal into a digital signal using the sample value;
   a controller to control the reference signal input and output the digital signal in response to the signal conversion unit; and
   a clock generation unit to input an operational clock to operate the unit, the signal conversion unit, and the controller.

8. The apparatus of claim 7, The sampling unit comprises an integration unit and a sample/hold unit.

9. The apparatus of claim 8, wherein the integration unit includes three operation amplifiers.

10. The apparatus of claim 7, wherein the first reference signal and the second reference signal which have absolute values greater than an absolute value of the analog signal and have a positive value and a negative value, respectively.

11. The apparatus of claim 8, wherein the reference voltage input unit inputs the second reference signal to the integration unit if the integral value of the integration unit is greater than a first threshold value.

12. The apparatus of claim 8, wherein the reference voltage input unit inputs the first reference signal to the integration unit if the integral value of the integration unit is less than a second threshold value, which is less than the first threshold value.

13. A method of converting an analog signal into a digital signal, the method comprising:
   inputting an analog signal;
   performing a sampling operation by taking an average value of the analog signal for a predetermined sample period as a sample value, the performing the sampling operation including integrating the analog signal during the predetermined sample period and sampling/holding an integral value obtained after the analog signal is integrated; and
   converting the analog signal into a digital signal using the sample value.

14. The method of claim 13, wherein the integrating includes integrating the analog signal for a predetermined sample period and dividing the integrated analog signal by the predetermined sample period.

15. The method of claim 13, wherein the performing of the sampling operation has:
   a first state in which the analog signal is integrated;
   a second state in which the integral value is sampled; and
   a third state in which the transmitted integral value is held.

16. The method of claim 13, further comprising inputting the analog signal and any one of a first reference signal and a second reference signal which have absolute values greater than an absolute value of the analog signal and have a positive value and a negative value, respectively.

17. The method of claim 16, wherein the inputting of the analog signal and any one of the first reference signal and the second reference signal comprises inputting the second reference signal if the integral value is greater than a first threshold value.

18. The method of claim 17, wherein the inputting of the analog signal and any one of the first reference signal and the second reference signal comprises inputting the first reference signal if the integral value is less than a second threshold value, which is less than the first threshold value.

* * * * *

UNITED STATES PATENT AND TRADEMARK OFFICE
CERTIFICATE OF CORRECTION

| | |
|---|---|
| PATENT NO. | : 7,605,729 B2 |
| APPLICATION NO. | : 11/715892 |
| DATED | : October 20, 2009 |
| INVENTOR(S) | : Nam et al. |

Page 1 of 1

It is certified that error appears in the above-identified patent and that said Letters Patent is hereby corrected as shown below:

Column 9, Line 32, after "operate the" insert --sampling--.

Column 9, Line 34, change "The" to --the--.

Signed and Sealed this

Nineteenth Day of January, 2010

David J. Kappos
*Director of the United States Patent and Trademark Office*